United States Patent
Wakayama

[11] Patent Number: 5,079,518
[45] Date of Patent: Jan. 7, 1992

[54] CURRENT-MIRROR CIRCUIT WITH BUFFERING TRANSISTOR

[75] Inventor: Myles H. Wakayama, Tokyo, Japan

[73] Assignee: Kabushiki Kaisha Toshiba, Kawasaki, Japan

[21] Appl. No.: 614,203

[22] Filed: Nov. 16, 1990

[30] Foreign Application Priority Data

Nov. 17, 1989 [JP] Japan .................................. 1-297730

[51] Int. Cl.⁵ .............................................. H03K 3/16
[52] U.S. Cl. ...................................... 330/288; 330/300
[58] Field of Search ..................... 307/296.6; 323/315, 323/316; 330/277, 288, 300, 307; 357/43

[56] References Cited

U.S. PATENT DOCUMENTS 4,473,794  9/1984  Early et al. ...................... 330/288 X
4,574,205  3/1986  Nagano ......................... 307/296.6 X

OTHER PUBLICATIONS

"Analysis & Design of Analog Integrated Circuits", Chapter 4, pp. 197-211, 1977, (1st Edition), Gray & Meyer.

Primary Examiner—Steven Mottola
Attorney, Agent, or Firm—Oblon, Spivak, McClelland, Maier & Neustadt

[57] ABSTRACT

A current-mirror circuit includes a pair of NMOS transistors. The first NMOS transistor has a gate electrode, a drain electrode serving as a current input terminal of the current-mirror circuit and a source electrode connected to a preselected potential. The second NMOS transistor has a gate electrode connected to the gate electrode of the first NMOS transistor, a drain electrode serving as a current output terminal of the current-mirror circuit and a source electrode connected to the preselected potential. The current-mirror circuit is provided with a buffer circuit. The buffer circuit includes a bipolar transistor which is opposite in polarity to the paired NMOS transistors, i.e., a PNP bipolar transistor. This transistor is associated with a constant current source.

20 Claims, 4 Drawing Sheets

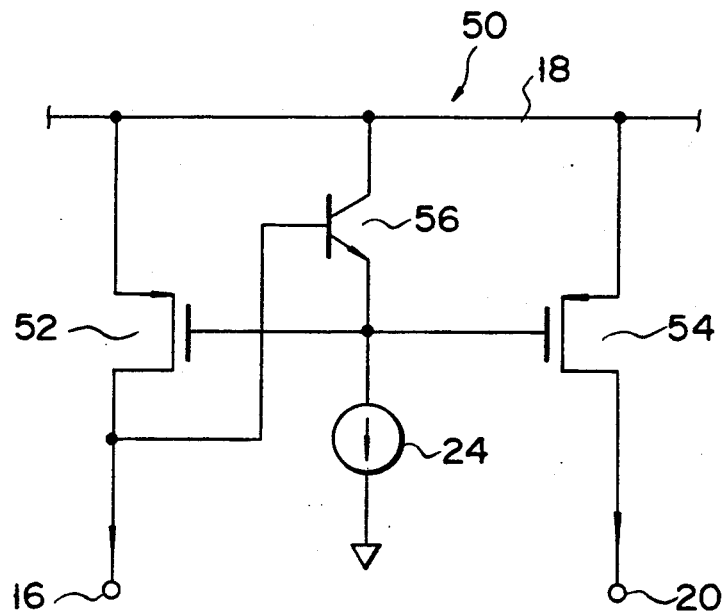
F I G. 3
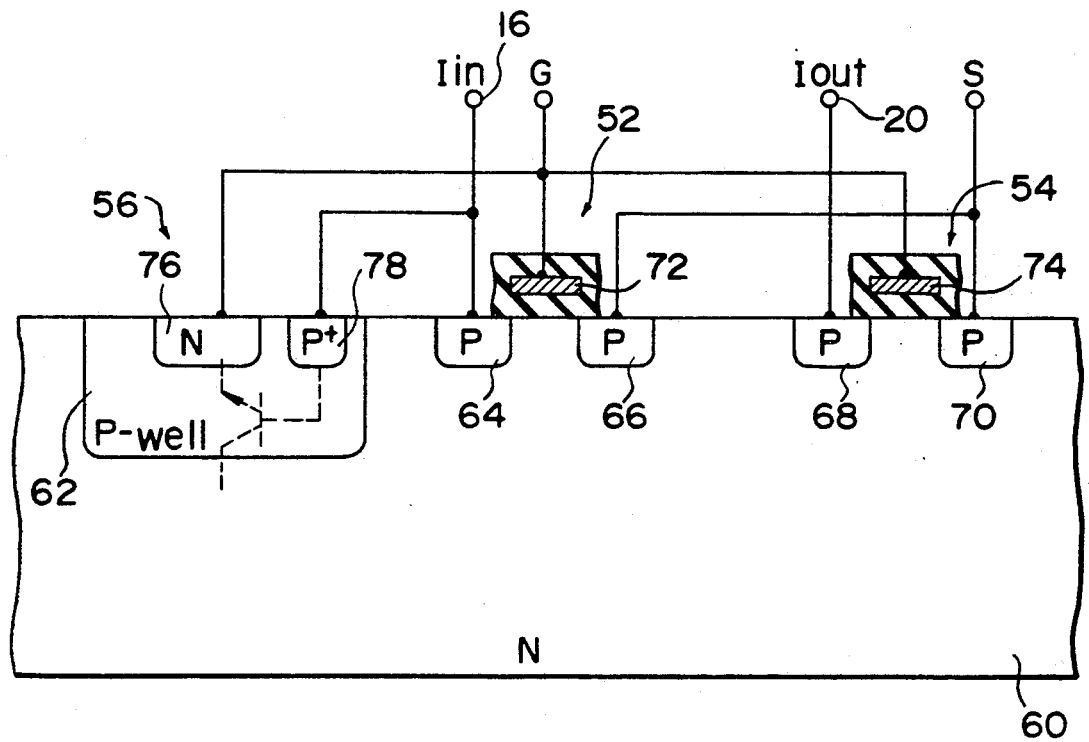
F I G. 4

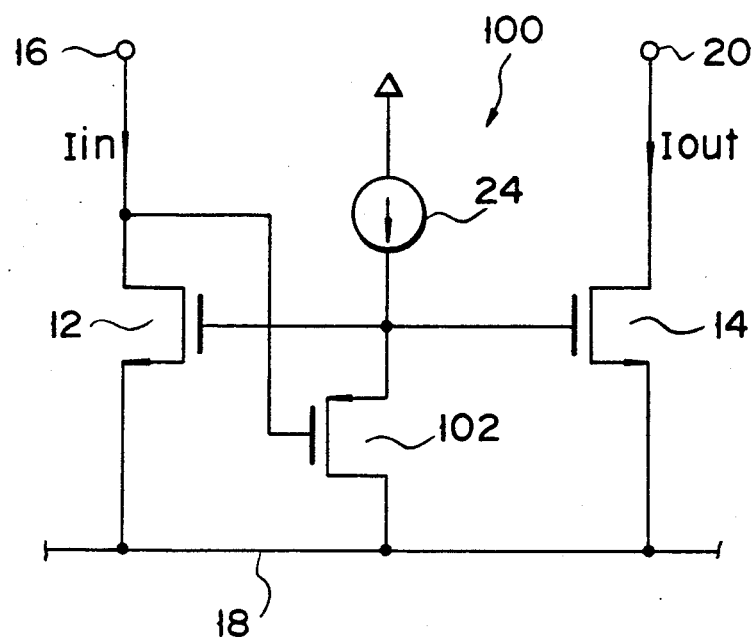
F I G. 5
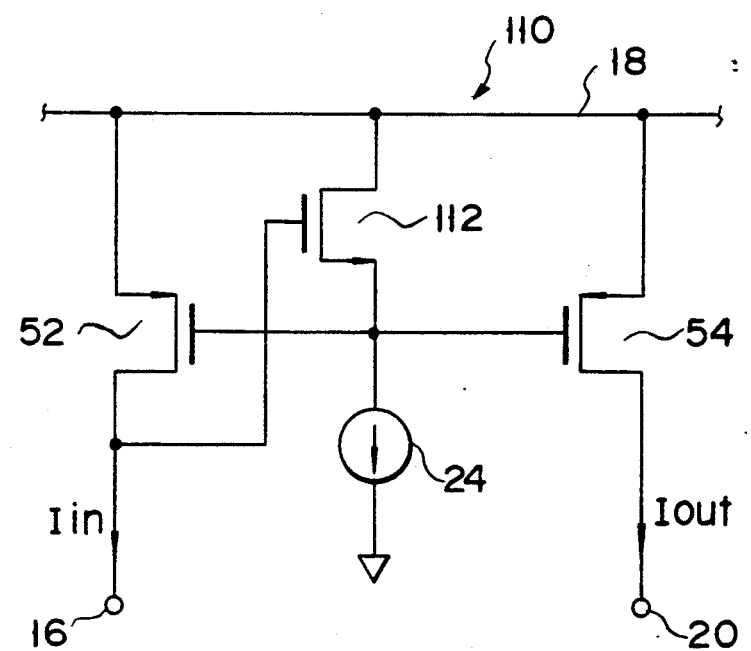
F I G. 6

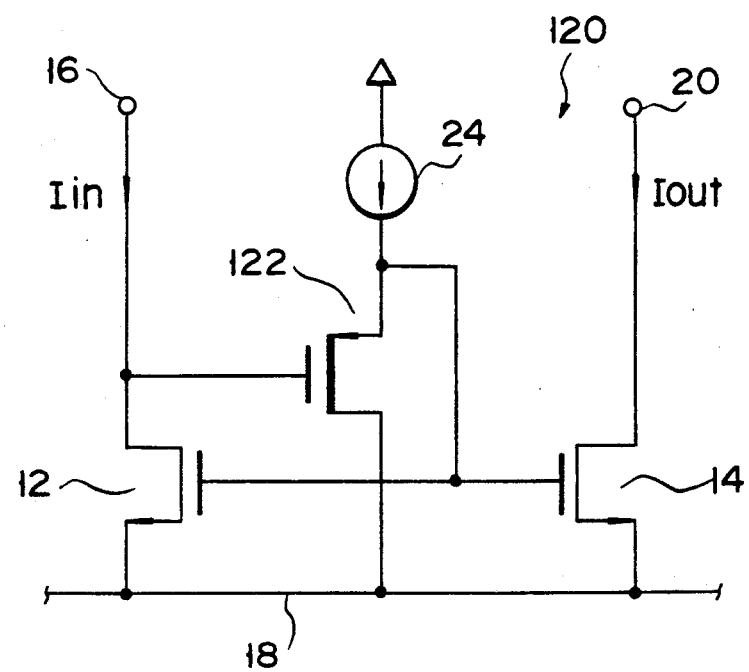
F I G. 7
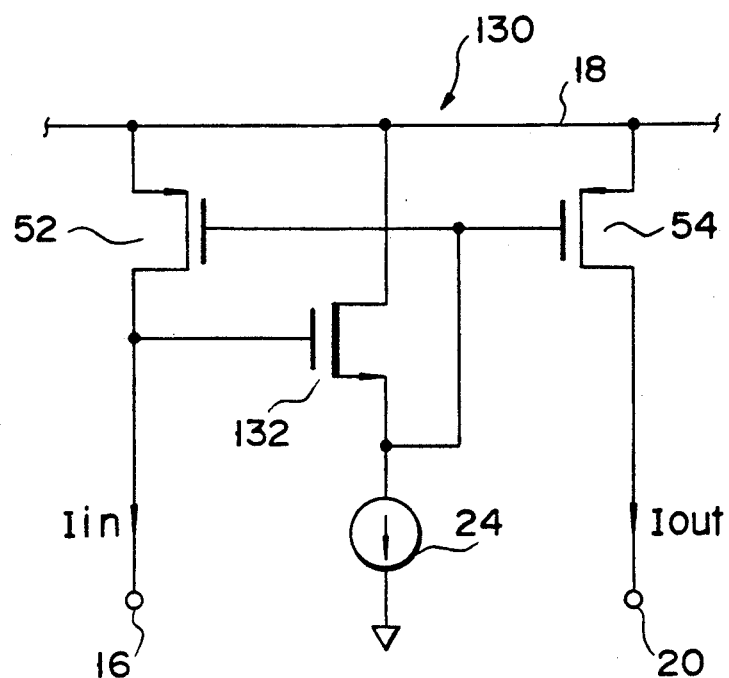
F I G. 8

CURRENT-MIRROR CIRCUIT WITH BUFFERING TRANSISTOR

BACKGROUND OF THE INVENTION

1. Field of the Invention

The present invention relates to current-mirror circuits and, more particularly, to current-mirror circuits composed mainly of unipolar transistors such as metal-oxide semiconductor transistors.

2. Description of the Related Art

Current-mirror circuits have found extensive applications in the technical field of analog electronic circuits, such as simple bias circuits, operational amplifiers, monolithic analog-to-digital converters, etc.

In general, with most electronic equipment using a current-mirror circuit, it is required that the frequency bandwidth of a current signal that the current-mirror circuit handles be as high as possible. If the frequency bandwidth of the current signal decreases, the performance of electronic equipment using the current-mirror circuit would be degraded.

With a presently available current-mirror circuit which has a pair of first and second metal-oxide semiconductor (MOS) transistors of a selected channel type, a third MOS transistor is provided additionally in order to maximize the frequency bandwidth of a current signal that the current-mirror circuit handles. The additional transistor is connected to the current input terminal of the current-mirror circuit and a common connection node of gate electrodes of the paired MOS transistors. The additional MOS transistor is the same as the paired MOS transistor in polarity, and has a source follower configuration. Thus, if the first and second MOS transistors are, for example, NMOS FETs, the third transistor will also be an NMOS FET. The third MOS transistor is connected at its drain electrode to the common-connected gate electrodes of the first and second MOS transistors, and connected at its gate electrode to the current input terminal of the current-mirror circuit. The third transistor is fed by a current source associated therewith. The third transistor serves as a "buffer" which can "free" the current signal input terminal from the influence of gate capacitances of the first and second MOS FETs. In this sense the third transistor may be called the "buffering transistor."

The third transistor, i.e., the buffering transistor can arbitrarily be set so that its bias current may become larger than an input current at the current input terminal of the current-mirror circuit and at the same time it is allowed to have an increased area. Thus, the polarity at the common connection node of the gate electrodes of the paired MOS transistors can be shifted to have a frequency higher than that at the input terminal, whereby the frequency bandwidth of the current-mirror circuit can be improved.

Using such a conventional circuit arrangement, however, the operating voltage level of the current-mirror circuit itself will increase This is because the addition of the buffering transistor of the same polarity as the paired main transistors increases the bias voltage substantially at the current input terminal by a voltage corresponding to the threshold voltage of the buffering transistor. Such an increase in the operating voltage level of the current-mirror circuit will result in an increase in power dissipation of electronic equipment incorporating it.

As described above, the presently available current-mirror circuit using MOS FETs is suffering from two conflicting problems: maximization of frequency bandwidth; and minimization of operating voltage level. Although anyone of those skilled in the art have felt that these problems are to be solvable, a satisfactory solution for them has not been found.

SUMMARY OF THE INVENTION

It is therefore an object of the present invention to provide a new and improved current-mirror circuit which has a high frequency bandwidth and is adaptable to a low supply voltage.

In accordance with the above object, the present invention is addressed to a specific current-mirror circuit which includes a pair of main transistors connected to each other at their gate electrodes. A buffering transistor is provided additionally, which is connected to a current input terminal of the current-mirror circuit and the common-connected gate electrodes of the paired main transistors. The buffering transistor is different in polarity from the main transistors. The use of the buffering transistor of the opposite polarity permits the operating voltage of the current-mirror circuit to be lowered while setting the frequency bandwidth of the current-mirror circuit high.

The invention and its objects and advantages will become more apparent from the detailed description of the preferred embodiments presented below.

BRIEF DESCRIPTION OF THE DRAWINGS

In the detailed description of the preferred embodiments of the present invention presented below, reference is made to the accompanying drawings in which:

FIG. 3 is a schematic illustration of a current-mirror circuit according to a second embodiment of the present invention;

FIG. 4 is a schematic sectional view of an integrated circuit device incorporating the current-mirror circuit of FIG. 2;

FIG. 5 is a schematic illustration of a current-mirror circuit according to a third embodiment of the present invention;

FIG. 6 is a schematic illustration of a current-mirror circuit according to a fourth embodiment of the present invention;

FIG. 7 is a schematic illustration of a current-mirror circuit according to a fifth embodiment of the present invention; and FIG. 8 is a schematic illustration of a current-mirror circuit according to a sixth embodiment of the present invention.

DETAILED DESCRIPTION OF THE PREFERRED EMBODIMENTS

Figure 1:
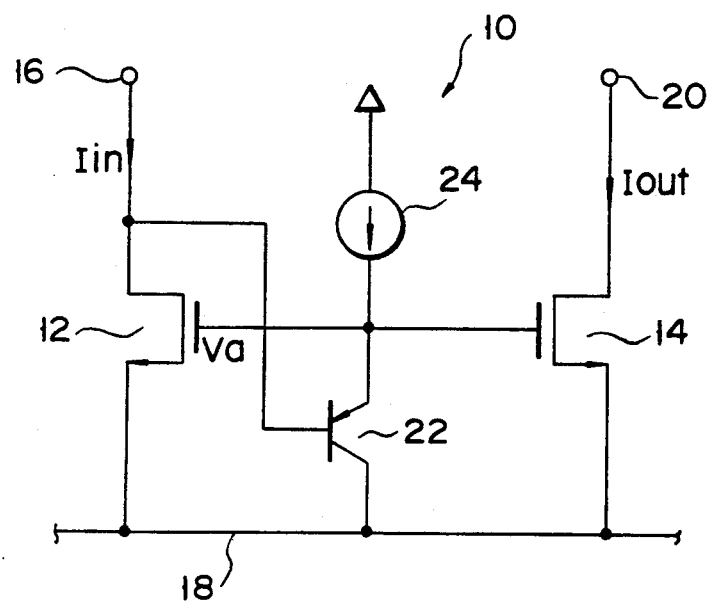
FIG. 1 is a schematic diagram of a current-mirror circuit according to a preferred embodiment of the present invention.

Referring now to FIG. 1, a current-mirror circuit according to a preferred embodiment of the present invention is indicated generally at reference numeral "10." The current-mirror circuit 10 has a pair of N-channel unipolar transistors 12 and 14. These transistors may be metal-oxide semiconductor (MOS) field effect transistors. These NMOS transistors 12 and 14 have their gate electrodes connected together.

The first NMOS transistor 12 has its drain electrode connected to a current input terminal 16 of the current-mirror circuit 10. In other words, the drain electrode of the NMOS transistor 12 serves as the current input terminal of the current-mirror circuit 10. The first NMOS transistor 12 has its source electrode connected to a line 18 of fixed potential. The line 18 is fixed at, for example, ground potential.

The second NMOS transistor 14 has its drain electrode connected to a current output terminal 20 of the current-mirror circuit 10 and its source electrode connected to the fixed-potential line 18. The first and second transistors 12 and 14 form the basic circuit arrangement of the current-mirror circuit 10. The current output terminal 20 of the current-mirror circuit 10 can be connected in general to a circuit component associated therewith (not shown).

As illustrated in FIG. 1, the third transistor 22 is connected between the "commonly-connected" gate electrodes of the first and second transistors 12 and 1 and the fixed-potential line 18. Note that the transistor 22 is a bipolar transistor which is opposite in polarity to the first and second transistors 12 and 14. In this embodiment, the paired main transistors 12 and 14 are of N channel type, so that the bipolar transistor 22 is specifically arranged to be of PNP type.

The PNP type bipolar transistor 22 has an emitter electrode connected to the common gate electrodes of the paired NMOS transistors 12 and 14, a collector electrode connected to the fixed-potential line 18 and a base electrode connected to the drain electrode of the first NMOS transistor 12, i.e., the input terminal 16 of the current-mirror circuit 10. A constant current source 24 is connected at its one end to the emitter electrode of the PNP bipolar transistor so as to supply it with a direct-current bias current constantly. The other end of the direct-current constant current source 24 is connected to the positive side of a power supply not shown.

With such an arrangement, the PNP type bipolar transistor 22 and its associated constant current source 24 function as a buffer circuit for the paired NMOS transistors 12 and 14. In particular, the bipolar transistor 22, which is opposite in polarity to the paired MOS transistors 12 and 14, serves to improve the frequency bandwidth of the current-mirror circuit 10 while reducing the operating voltage level of the current-mirror circuit to a low level as desired, as will be explained in detail hereinafter.

In the current-mirror circuit 10, the first NMOS transistor 12 serves as an input element which converts a current signal (let its current value be "Iin") externally applied to the input terminal 16 to a voltage signal Va. The voltage signal Va appears at the gate electrode of the first NMOS transistor 12. The voltage signal Va is expressed by:

$$V(a) = V_{gs1} \qquad (1)$$
$$= V_{th} + \sqrt{\frac{2 \cdot I_{in} \cdot L1}{\mu C_{ox} \cdot W1}}$$

where "Vgs1" is the gate-to-source voltage of the NMOS transistor 12, "Vth" is the threshold voltage of the NMOS transistor 12, "L1" is the length of the gate electrode of the NMOS transistor 12, "W1" is the width of the gate electrode of the NMOS transistor 12, "$\mu$" is the electron mobility, and "Cox" is the oxide capacitance.

On the other hand, the second NMOS transistor 14 functions as the output element of the current-mirror circuit 10. The second NMOS transistor 14 is adapted to convert the voltage signal Va applied to its gate electrode to a current signal (let its current value be "Iout"). The resulting current signal Iout appears at the drain electrode of the NMOS transistor 12, i.e., the output terminal 20 of the current-mirror circuit 10. The conversion of the voltage signal Va to the current signal Iout is described by the equation:

$$I_{out} = I_d \qquad (2)$$
$$= \frac{\mu C_{ox} \cdot W2}{2L2} \cdot (V_a - V_{th})^2$$

where "Id" is the drain current of the NMOS transistor 14, "L2" is the length of the gate electrode of the NMOS transistor 14, and "W2" is the width of the gate electrode of the NMOS transistor 14.

Since the drain-to-source resistance of each of the NMOS transistors 12 and 14 is negligibly small, it is omitted from equations (1) and (2). By rearranging equations (1) and (2), the transfer function of the current-mirror circuit 10 is given by:

$$I_{out} = \frac{W2}{L2} \cdot \frac{L1}{W1} \cdot I_{in} \qquad (3)$$

The buffer circuit comprised of the PNP bipolar transistor 22 and the constant current source 24 performs such a buffering function as prevents the input terminal 16 of the current-mirror circuit 10 connected to the base electrode of the PNP bipolar transistor 22 from being affected by the gate capacitances of the paired NMOS transistors 12 and 14. Thus, the input capacitance of the current-mirror circuit 10 which is see at the current input terminal 16 will essentially become equivalent to the capacitance associated with the base electrode of the PNP bipolar transistor 22. The base capacitance of the PNP bipolar transistor is smaller than the combined gate capacitance Cgate of each of the NMOS transistors 12 and 14 which is essentially equal to:

$$C_{gate} = \frac{2}{3} \cdot W \cdot L \cdot C_{ox} \qquad (4)$$

This improves the high-frequency characteristic of and widens the frequency bandwidth of the current-mirror circuit.

Furthermore, the fact that the conductance of the PNP bipolar transistor 22 is larger than that of a CMOS structure, which has generally been used, contributes to extension of the frequency bandwidth of the current-mirror circuit of the present invention.

In addition, according to the above embodiment, the drain voltage of the first NMOS transistor 12 is lower than its gate voltage by the base-to-emitter voltage Vbe of the PNP bipolar transistor 22 of the buffer circuit. This allows the drain-to-source voltage Vds of the first NMOS transistor 12 to be decreased, thus lowering the bias voltage level at the drain electrode of the first NMOS transistor 12 making it highly suitable for use in low operating voltage applications. The fact is suited for realization of the use of a low operating voltage with the current-mirror circuit 10. More specifically, the gate-to-source voltage Vgs of the first NMOS transistor 12 is approximately equal to its threshold voltage Vth, typically on order of one volt. As is well known, the base-to-emitter voltage of the PNP bipolar transistor 22 is approximately 0.7 volts. Therefore, the drain-to-source voltage of the NMOS transistor 12 which is the input element of the current-mirror circuit will be 0.3 volts, which corresponds to the difference between voltages Vgs and Vbe. With a conventional current-mirror circuit with a buffering circuit, the drain-to-source voltage Vds of an NMOS transistor serving as the input element is about 2 volts. It is therefore extermely useful that the operating voltage of the current-mirror circuit of the present invention is significantly decreased to 0.3 volts, which is 1.7 volts less than the 2 volts required by the prior art circuit.

With the operating voltage of the current-mirror circuit 10 lowered, it becomes possible to decrease the width of the gate electrode of each of the MOS transistors 12 and 14. For a given operating voltage in such a decrease in the width of the gate electrode will result in a decrease in the occupied area of the current-mirror circuit on a semiconductor integrated circuit chip and thus be highly desirable to semiconductor device manufacturers.

In incorporating the current-mirror circuit illustrated in FIG. 1 in an actual device, careful attention should be paid to a risk that the first NMOS transistor 12 may enter the triode mode which is generally the nonlinear mode. In the case of an electronic circuit using a MOS transistor, the nonlinear mode occurs theoretically when the gate potential of the transistor becomes higher than its drain potential by its threshold voltage Vth, that is, when $$Vdg < -Vth \quad (5)$$

for an NMOS transistor or when $$Vdg > Vth \quad (5')$$

for a PMOS transistor. Considering such a fact, in the case of the current-mirror circuit of FIG. 1, by setting the threshold voltage Vth of the first NMOS transistor 12 higher than the base-to-emitter voltage Vbe of the PNP bipolar transistor 22, it becomes possible to prevent the transistor 12 from entering the nonlinear mode for all input current supplied in the input terminal.

Figure 2:
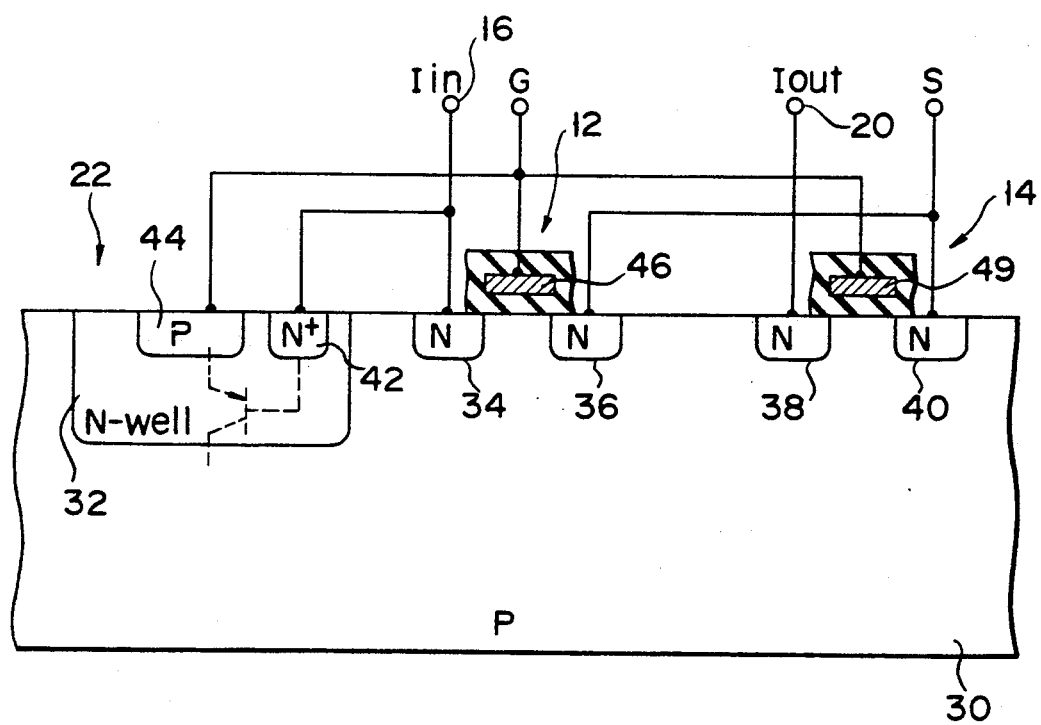
FIG. 2 is a schematic sectional view of an integrated circuit device incorporating the current-mirror circuit of FIG. 1.

The current-mirror circuit of FIG. 1 can readily be implemented in an integrated-circuit device as illustrated in FIG. 2 by the use of a CMOS fabrication technology or bipolar CMOS (generally abbreviated to BiCMOS) fabrication technology which is well established existing semiconductor manufacturing processes.

In FIG. 2, an IC device implemented in accordance with the N-well type CMOS process has a P type silicon substrate 30. In a selected area on the top surface of the substrate 30 is formed an N type well region 32. By selective doping of the substrate 30 with N type semiconductor impurities N type semiconductor layers 34, 36, 38 and 40 are formed as illustrated. In the N type well region 32 a heavily doped N type semiconductor layer 42 is formed. In the N type well region 32 is also formed a P type semiconductor layer 44 which is formed close to the heavily doped N type semiconductor layer 42.

A conductive layer 46, which is substantially self-aligned with the N type layers 34 and 36, is insulatively disposed above the substrate 30. The first NMOS transistor 12 is formed of the conductive layer 46 serving as its gate electrode, the N type layer 34 serving as its drain and the N type layer 36 serving as its source. Likewise a conductive layer 49, which is also substantially self-aligned with the N type layers 38 and 40, is disposed above the substrate 30. The second NMOS transistor 14 is formed by the use of the conductive layer 50 as its gate electrode, the N type layer 38 as its drain and the N type layer 40 as its source. The layers 30, 32, 42 and 44 form a PNP type parasitic bipolar transistor as indicated by broken lines in FIG. 2, which serves as the PNP bipolar transistor 22 described above. Subsequently, the structure of FIG. 2 is wired by the use of a conventional wiring technique, thereby completing a current-mirror circuit. Note that the constant current source 24 of FIG. 1 is omitted from FIG. 2.

By forming the PNP bipolar transistor 22 involved in the buffer circuit of the current-mirror circuit 10 with a parasitic transistor in particular, it becomes possible to manufacture an IC device incorporating the current-mirror circuit of the present invention at a high yield without any modification to an ordinary CMOS process.

Referring now to FIG. 3, there is illustrated a current-mirror circuit according to a second embodiment of the present invention which is generally represented by "50." For simplicity of description like reference characters are used to designate corresponding parts to those in FIG. 1 and their iterative description will be omitted.

The current-mirror circuit 50 of FIG. 3 is characterized in that it essentially results from reversal of the current-mirror circuit 10 of FIG. 1 with respect to the polarity of the supply voltage. More specifically, the current-mirror circuit 50 has a pair of PMOS transistors 52 and 54 connected to each other at their gate electrodes. The first PMOS transistor 52 is connected to the current input terminal 1 at its drain electrode and to the line 1 of fixed potential, such as ground potential, at its source electrode. On the other hand, the second PMOS transistor 54 is connected to the current output terminal 20 at its drain electrode and to the fixed-potential line 18 at its source electrode.

A bipolar transistor which is distinct from the paired PMOS transistors 52 and 54 in polarity, i.e., an NPN bipolar transistor 56, is provided between the common gates of the PMOS transistors 52 and 54 and the fixed-potential line 18. The NPN bipolar transistor 56 has a base electrode connected to the drain electrode of the first PMOS transistor 52, i.e., the current input terminal 16 of the current-mirror circuit 50, an emitter electrode connected to the common gates of the PMOS transistors 52 and 54 and a collector electrode connected to the fixed-potential line 18. The NPN bipolar transistor 56 is associated with the constant current source 24, which is connected to the common gates of the paired PMOS transistors 52 and 54 and a negative power supply not shown.

FIG. 4 shows a schematical sectional structure of an IC device incorporating the current-mirror circuit 50 described above. An N type silicon substrate 60 has a major surface in which a P type well region 62 and P type semiconductor diffusion layers 64, 66, 68 and 70 are formed. A pair of P type semiconductor diffusion layers 64 and 66 and a conductive layer 72, which is disposed above the layers 64 and 66 so as to be insulated from the substrate and serves as the gate electrode, form the first PMOS transistor 52. In this case, the P type layer 64 serves as the drain and the P type layer 66 serves as the source. The other pair of P type semiconductor diffusion layers 68 and 70 and a conductive layer 74, which is disposed above the layers 68 and 70 so a to be insulated from the substrate, form the second PMOS transistor 54. In this case, the conductive layer 74 serves as the gate electrode, the P type layer 68 serves as the drain and the P type layer 70 serves as the source.

In the P type well region 62 are formed an N type diffusion layer 76 and a heavily doped P type diffusion layer 78. A parasitic bipolar transistor (indicated by broken lines in FIG. 4) formed by layers 60, 62, 76 and 78 is use as the NPN bipolar transistor 56 of the buffer circuit described previously.

Several modifications of the current-mirror circuit of the present invention will be described below. First, a current-mirror circuit 100 illustrated in FIG. 5 has the same basic arrangement as that of FIG. 1 but is distinct from the latter in that the PNP buffer transistor 22 forming the buffer circuit is replaced by an enhancement type PMOS transistor 102. By constructing the current-mirror circuit with the buffer circuit from only MOS transistors without using any bipolar transistor as in the modification, the manufacturing process can be simplified.

In addition, the modification is further advantageous to reduction of the operating voltage (biassing voltage) of the current-mirror circuit. Such is the case since the drain potential of the first NMOS transistor 12 is lower than its gate potential by the gate-to-source voltage Vg of the PMOS transistor 10 of the buffer circuit, and therefore the drain-to-source voltage Vds of the first NMOS transistor 12 is reduced by a corresponding voltage.

A current-mirror circuit 110 illustrated in FIG. 6 has the same basic arrangement as the circuit of FIG. 3. This current-mirror circuit is distinct from the current-mirror circuit 10 of FIG. 1 in that an enhancement type NMOS transistor 112 is used i place of the NPN bipolar transistor 56 forming the buffer circuit. With such an arrangement, the drain potential of the first MOS transistor 112 is higher than its gate potential by the gate-to-source voltage Vgs of the NMOS transistor 112 of the buffer circuit and, therefore, the drain-to-source voltage of the first PMOS transistor 52 is reduced by a corresponding voltage. The circuit arrangement is therefore suitable for reducing of the operating voltage of the current-mirror circuit.

With a current-mirror circuit 120 illustrated in FIG. 7, the enhancement type PMOS transistor 102 of the current-mirror circuit 100 shown in FIG. 5 is replaced by a depletion type PMOS transistor 122. A current-mirror circuit 130 illustrated in FIG. 8 is likewise formed by replacing the enhancement type NMOS transistor 112 of the current-mirror circuit shown in FIG. 6 by a depletion type NMOS transistor 132.

As described previously, for a NMOS transistor to operate in the liner mode, its the gate electrode voltage must not exceed the drain electrode voltage by more than its threshold voltage Vth, as previously shown in equation (5). Therefore, regarding the current mirror circuit 100 illustrated in FIG. 5, if the source electrode to gate electrode voltage of the enhancement type PMOS transistor 102 exceeds the threshold voltage Vth of the first NMOS transistor 12, the first NMOS transistor 12 will not operate in the linear mode as determined by equation (5), and the performance of the current mirror circuit 100 will be degraded. Similarly, regarding the current mirror circuit 110 illustrated in FIG. 6, if the gate electrode to source electrode voltage of the enhancement type NMOS transistor 112 exceeds the threshold voltage Vth of the first PMOS transistor 52, the first PMOS transistor 52 will not operate in the linear mode as determined by equation (5), and the performance of the current mirror circuit 110 will be degraded. Therefore, it is important in both the current mirror circuit 100 or FIG. 5 and the current mirror circuit 110 of FIG. 6 that the absolute valve of the MOS transistor used in the buffer circuit, i.e., the PMOS transistor 102 of the current mirror circuit 100, and the NMOS transistor 112 of the current mirror circuit 110, be respectively less than the threshold voltage Vth of the first NMOS transistor of the current mirror circuit 100 of FIG. 5, and the first PMOS transistor of the current mirror circuit 110 of FIG. 6, which is sometimes difficult to achieve design-wise.

By definition, a depletion type PMOS transistor has a more positive valued threshold voltage Vth than an enhancement type PMOS transistor. Correspondingly, for a given bias current, a depletion type PMOS transistor has a lower source electrode to gate electrode voltage than an enhancement type PMOS transistor. Therefore, the current mirror circuit 120 illustrated in FIG. 7, as described previously, uses a depletion type PMOS transistor 122 for the buffer circuit achieving a lower source electrode to gate electrode voltage than the enhancement type PMOS transistor 102 of the current mirror circuit 100, therefore, considerably easing the design difficultly with regards to guaranteeing linear operation of the first NMOS transistor 12 of the current mirror circuit 120, over the design of a current mirror circuit 100.

Likewise, by definition, a depletion type NMOS transistor has a more negative valued threshold voltage Vth than an enhancement type NMOS transistor. Correspondingly, for a given bias current, a depletion type NMOS transistor has a lower gate electrode to source electrode voltage than an enhancement type NMOS transistor. Therefore, the current mirror circuit 130 illustrated in FIG. 8, as described previously, uses a depletion type NMOS transistor 132 for the buffer circuit achieving a lower gate electrode to source electrode voltage than the enhancement type NMOS transistor 112 of the current mirror circuit 110, therefore, considerably easing the design difficultly with regards to guaranteeing linear operation of the first PMOS transistor 12 of the current mirror circuit 130, over the design of a current mirror circuit 110.

The present invention is not limited to the above-described specific embodiments and may be practiced or embodied in still other ways without departing from the spirit or essential character thereof.

For instance, an approach in which resistance elements of different values are respectively inserted between the source of one of paired MOS transistors of a current-mirror circuit and the fixed-potential line 18 and/or between the source of the other of the paired MOS transistors and the line 18 so as to make the input current Iin and the output current Iout unequal to each other, may also be applied to any one of the current-mirror circuits of the present invention if desired. Also, instead of using the fixed-potential line 18, a modification may be made, if desired, such that the source potentials of the paired MOS transistors may be made different from each other.

What is claimed is:

1. A current-mirror circuit comprising:
    a semiconductive substrate having a semiconductive well region having a conductivity type opposite to said substrate;
    a pair of unipolar main transistors arranged on said substrate and each comprising a gate electrode, wherein said unipolar main transistors are connected to each other at said gate electrodes; and
    a buffering transistor arranged in said well region and connected to a current input of said current-mirror circuit and to said gate electrodes of said pair of main transistors, said buffering transistor being different in polarity from said main transistors.

2. The circuit according to claim 1, in which said unipolar transistors are of the same conductivity type.

3. The circuit according to claim 2, in which said buffering transistor comprises a bipolar transistor of opposite polarity to said unipolar transistors.

4. The circuit according to claim 2, in which said buffering transistor comprises a unipolar transistor of opposite polarity to said unipolar transistors.

5. The circuit according to claim 2, in which said buffering transistor is adapted to be associated with a constant current source so as to be current-driven constantly.

6. The circuit according to claim 5, in which said main transistors are connected to said constant current source at said connected gate electrodes.

7. A current-mirror adapted to be arranged on a semiconductive substrate with a well region of a conductivity type opposite to that of the substrate comprising:
    a first metal-oxide semiconductor transistor having a gate electrode, a source electrode, and a drain electrode serving as a current input terminal of said current-mirror circuit;
    a second metal-oxide semiconductor transistor having a gate electrode connected to said gate electrode of said first transistor, a source electrode, and a drain electrode serving as a current output terminal of said current-mirror circuit; and
    a buffer circuit including a third transistor of opposite polarity to said first transistor and second transistor, said third transistor having an input connected to said current input terminal and an output connected to said gate electrodes of said first and second transistors, said third transistor being formed in said well region.

8. The circuit according to claim 7, in which majority carriers of said third transistor differ from majority carriers of said first and second transistors in polarity.

9. The circuit according to claim 7, in which said third transistor comprises a bipolar transistor.

10. The circuit according to claim 9, in which said bipolar transistor is connected to said current input terminal at its base electrode.

11. The circuit according to claim 10, in which said first and second transistors each comprise NMOS transistors, whereas said third transistor comprises a PNP bipolar transistor.

12. The circuit according to claim 10, in which said first and second transistors each comprise PMOS transistors, whereas said third transistor comprises an NPN bipolar transistor.

13. The circuit according to claim 7, in which said third transistor comprises an enhancement-type metal-oxide semiconductor transistor.

14. The circuit according to claim 13, in which said enhancement-type metal-oxide semiconductor transistor is connected to said current input terminal at its gate electrode.

15. The circuit according to claim 14, in which said first and second transistors each comprise NMOS transistors, whereas said third transistor comprises a PMOS transistor.

16. The circuit according to claim 14, in which said first and second transistors each comprise PMOS transistors, whereas said third transistor comprises an NMOS transistor.

17. The circuit according to claim 7, in which said third transistor comprises a depletion-type metal-oxide semiconductor transistor.

18. The circuit according to claim 17, in which said depletion-type metal-oxide semiconductor transistor is connected to said current input terminal at its base electrode.

19. The circuit according to claim 18, in which said first and second transistors each comprise NMOS transistors, whereas said third transistor comprises a PMOS transistor.

20. The circuit according to claim 18, in which said first and second transistors each comprise PMOS transistors, whereas said third transistor comprises an NMOS transistor.

* * * * *